United States Patent
Tao

(10) Patent No.: US 6,950,356 B2
(45) Date of Patent: Sep. 27, 2005

(54) NON-VOLATILE MEMORY TEST STRUCTURE AND METHOD

(75) Inventor: Guoqiao Tao, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/505,835
(22) PCT Filed: Jan. 31, 2003
(86) PCT No.: PCT/IB03/00368
§ 371 (c)(1),
(2), (4) Date: Aug. 25, 2004
(87) PCT Pub. No.: WO03/073434
PCT Pub. Date: Sep. 4, 2003

(65) Prior Publication Data
US 2005/0094439 A1 May 5, 2005

(30) Foreign Application Priority Data
Feb. 26, 2002 (EP) ............................................ 02075761

(51) Int. Cl.[7] .............................................. G11C 16/06
(52) U.S. Cl. .............. 365/201; 365/185.05; 365/185.11
(58) Field of Search ........................... 365/201, 185.05, 365/185.11, 185.09

(56) References Cited

U.S. PATENT DOCUMENTS

| | | | | |
|---|---|---|---|---|
| 5,515,318 A | * | 5/1996 | Cappeletti et al. | 365/185.09 |
| 6,128,219 A | * | 10/2000 | Pio et al. | 365/185.09 |
| 6,320,201 B1 | * | 11/2001 | Corbett et al. | 257/48 |
| 6,747,471 B1 | * | 6/2004 | Chen et al. | 324/765 |
| 6,791,171 B2 | * | 9/2004 | Mok et al. | 257/678 |

* cited by examiner

Primary Examiner—Vu A. Lee
(74) Attorney, Agent, or Firm—Peter Zawilski

(57) ABSTRACT

The invention relates to a non-volatile memory test structure, comprising a plurality of memory cells arranged in rows and columns, each memory cell comprising at least a memory transistor and having a source terminal, a gate terminal and a drain terminal. In order to provide a fast and effective test structure to be used for fast reliability evaluation in monitoring of non-volatile memory elements on every wafer it is proposed according to the present invention that:—a group of said memory cells is connected in parallel,—the source terminals of the memory cells in the group are connected together and to a source line,—the drain terminals of the memory cells in the group are connected together and to a drain line,—the gate terminals of the memory cells in the group are connected together and to a gate line, and—said gate line has two connections to apply an electrical current to said gate line for using it as a heating means.

13 Claims, 7 Drawing Sheets

NON-VOLATILE MEMORY TEST STRUCTURE AND METHOD

Figure 1:
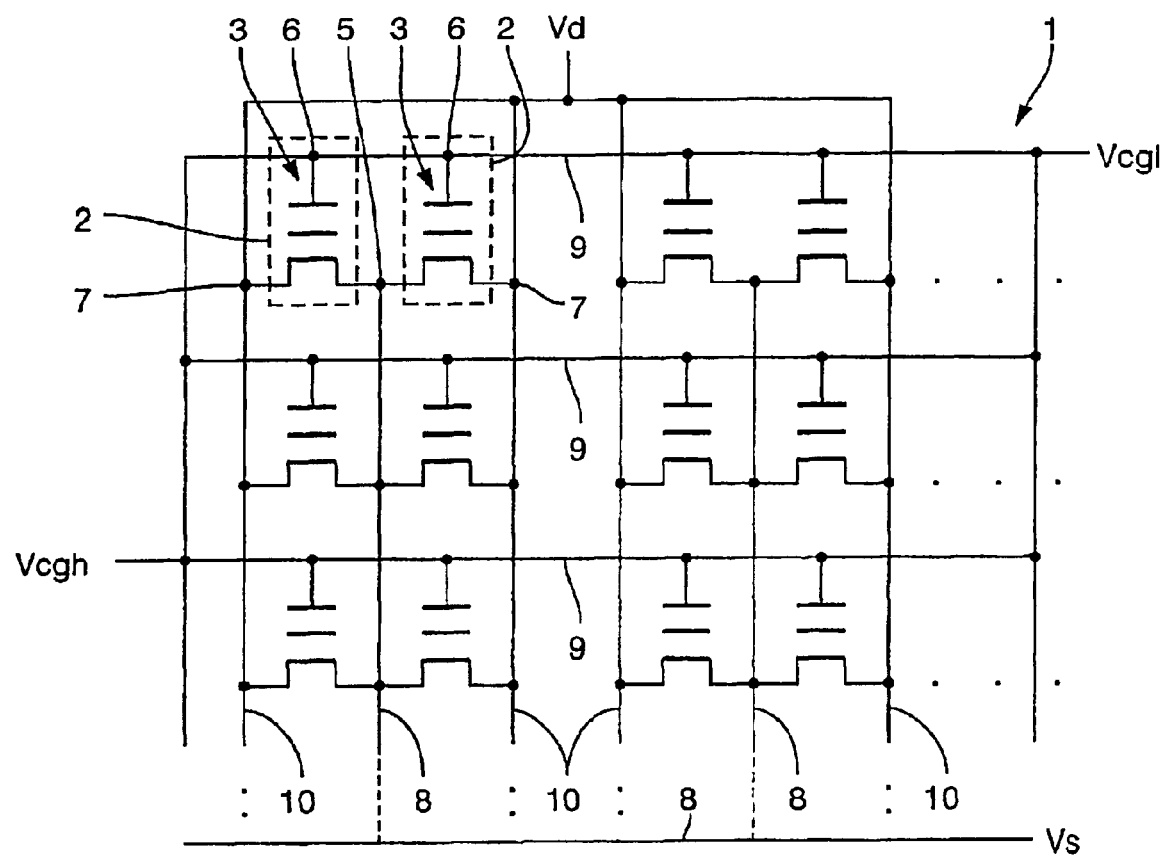

The invention relates to a non-volatile memory test structure, comprising a plurality of memory cells arranged in rows and columns, each memory cell comprising at least a memory transistor and having a source terminal, a gate terminal and a drain terminal. Further, the invention relates to a corresponding non-volatile memory test method for testing such a test structure and to a semiconductor wafer comprising such a test structure.

A main problem in non-volatile EEPROM and flash EEPROM devices resides in the difficulty of measuring the distribution of the threshold voltage of memory cells. In particular, a reliable method for precisely measuring the threshold voltage distribution is very useful and becomes very important as a quality check. The reliability of the tunnel oxide may be measured through very simple structures, such as capacitors, using different techniques, such as constant current stress or linear ramp voltage stress, exponential ramp current stress. Particularly, controlling the reliability parameters like write/erase endurance, data retention and stress induced leakage current (SILC) is required. However, there is still a lack of effective test structures and test methods evaluating these reliability characteristics.

A test structure of the kind as mentioned above is disclosed in U.S. Pat. No. 6,128,219, which test structure is formed by an array of memory cells connected in parallel and including each a memory transistor and a select transistor connected in series. The gate terminals of the select transistors of all memory cells are biased to a value next to the threshold voltage of the select transistors. Therefore, in each memory cell, the drain current is limited by the memory transistor for control gate voltages below the threshold voltage of the memory transistor, and by the select transistor at higher voltages. For high control gate voltages, the drain current is clamped to a constant maximum value. Since the clamping effect of the select transistors acts on each memory cell, the total maximum current of the test structure may be held below a value causing a limitation in the current generated by the entire array because of the resistance in series to the output of the test structure. Thus, also the right side of the threshold distribution may be evaluated and the presence of defective cells causing injection of electrons in the floating gate of the memory transistors may be detected. Such a cell array stress test (CAST) structure is useful in yield and reliability measurements. However, a more effective test structure is required.

It is therefore an object of the present invention to provide a non-volatile memory test structure and a corresponding test method which are more effective than known test structures and methods and which allow to achieve a fast reliability and yield evaluation.

This object is achieved according to the present invention by a non-volatile memory test structure as claimed in claim 1, wherein:
- a group of said memory cells is connected in parallel,
- the source terminals of the memory cells in the group are connected together and to a source line,
- the drain terminals of the memory cells in the group are connected together and to a drain line,
- the gate terminals of the memory cells in the group are connected together and to a gate line, and
- said gate line has two connections to apply an electrical current to said gate line for using it as a heating means.

The invention is based on the idea that reliability evaluation in non-volatile memory test structures can be accelerated by measurements at high temperature. High temperature can be rapidly realized very localized on a wafer by making use of an integrated heater which is used as a self-heater. The gate line to which the gate terminals of the memory cells are connected is thus provided with two connections according to the present invention which allows to apply an electrical current to said gate line so that it can be used as a heating means for localized self-heating. By forcing an electrical current through the control gates, the test structure becomes self-heated making it possible to stress the test structure at elevated temperature.

The proposed solution has a number of advantages compared to the known solutions. It is simple to understand and to implement but is very effective to reveal the endurance and SILC behaviour. The test structure can be placed in the process control module (PCM) provided on every wafer to control the wafer quality and is therefore product independent. The test structure can also be easily ported to other processes and/or semiconductor factories with the corresponding testing routines without additional investment. Every wafer and every lot can be covered with such a test structure. The measuring time is considerably reduced. The test is now performed at a stage after the wafer process is finished which provides a very fast feedback time. The structure can be tested at metal one level to reveal the front-end process quality, shortening the feedback time further more.

Preferred embodiments of the invention are defined in the dependent claims. In order to illuminate the gate voltage influence during self-heating, the gate terminals can be grouped into a first and a second group, particular into odd and even gate terminals as defined in claim 2, which groups are connected to a first (odd) and a second (even) gate line. One of these groups is preferably used as heating means while the other group can be used to apply a gate stress or endurance cycling by Fowler-Nordheim (FN) tunnelling.

The invention can be applied to any kind of non-volatile memory test structures. Preferably, the invention is implemented in test structures comprising a 1-transistor flash EEPROM array where each memory cell comprises a single memory transistor or a 2-transistor cell array test structure where each memory cell comprises a memory transistor and a select transistor connected in series as defined in claim 3. The general layout of an 1-transistor and a 2-transistor cell array test structure are described in the above mentioned U.S. Pat. No. 6,128,219, which description is herein incorporated by reference. While in a 1-transistor cell array test structure according to the present invention only one gate line is provided having two connections for using said gate line as heating means, in a 2-transistor cell array test structure as defined in claim 3 a control gate line to which the control gate terminals of the memory cells are connected and an access gate line to which the access gate terminals of the select transistors are connected are provided and either one of them or both can be provided with two connections to apply an electrical current allowing to use it as heating means or employing the described self-heating effect. Preferably, said control gate lines are used as heating means. In addition, a first and a second control gate line can be provided to which a first and a second number of control gate terminals is connected, such as the odd or, respectively, the even numbered control gate terminals as defined in claim 4. However, it should be noted that the invention and this preferred embodiment can also be applied to other test structure, e.g. having 3-transistor cell arrays, in particular having 2 access gates and 1 floating gate or having 2 floating gates and 1 access gate, as described in Imamiya et al, presented at the IEEE Non-Volatile Semiconductor Memory Workshop 2000. Feb. 13–16, 2000, pp 78–80.

The temperature of the self-heated array can be monitored by the drain line resistance change since the drain line is made of metal, i.e. the drain line is used as a temperature measuring means as defined in claim 5. A separate connection of a first number of the drain terminals to a first drain line and of a second number of drain terminals to a second drain line allows separation of the resistance change from junction leakage. In an alternative embodiment of the invention a separate metal line, without drain contacts, is used to measure the temperature.

According to a further embodiment of the present invention a feedback-loop is provided from said drain line or said separate metal line to said gate line, in particular to a power supply means for applying an electrical current to said gate line. Said feedback-loop allows to keep a pre-set temperature constant during stress. Said feedback-loop allows during heating to control the gate line, i.e. the heating means, by the drain line, i.e. the thermometer, by adjusting the voltage or current supplied to the gate line.

The present invention also relates also to a semiconductor wafer comprising a number of non-volatile memory devices and a non-volatile memory test structure as claimed in claim 1.

Still further, the present invention relates to a non-volatile memory test method for testing a test structure as claimed in claim 1, comprising the steps of:

connecting a group of said memory cells in parallel, connecting the source terminals of the memory cells in the group together and to a source line, connecting the drain terminals of the memory cells in the group together and to a drain line, connecting the gate terminals of the memory cells in the group together and to a gate line, applying an electrical current to said gate line having two connections, using said gate line as a heating means, and measuring the electrical behaviour of said memory cells.

During the test method according to the present invention an endurance test, a gate stress, a drain stress and/or a continuous read stress can be performed, in particular at an elevated temperature. The endurance of the memory cells can be evaluated by measurement of the cell threshold voltage before and after the stress or between the stress intervals.

Preferred embodiments of the test method are defined in dependent claims 12 and 13, particularly for measuring the endurance stress or making a retention measurement at elevated temperature.

Figure 2:
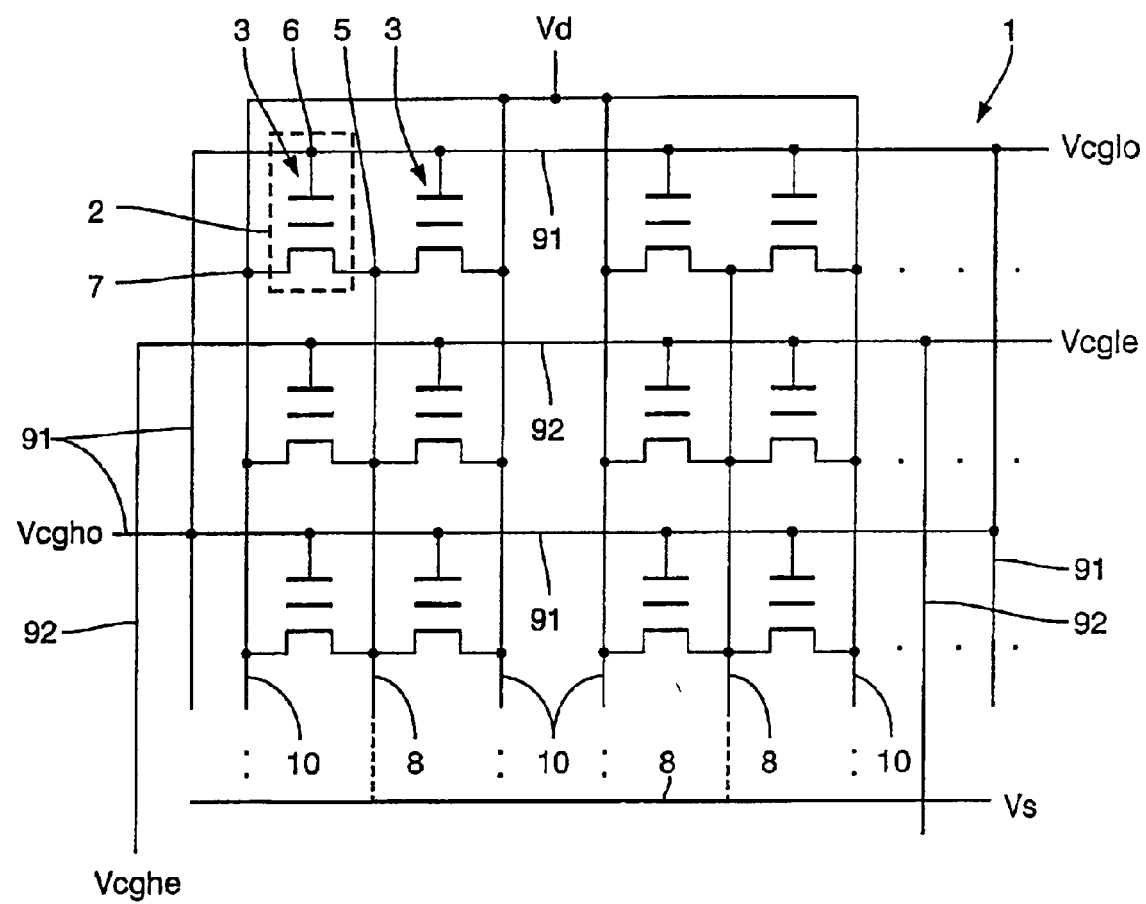
Figure 3:
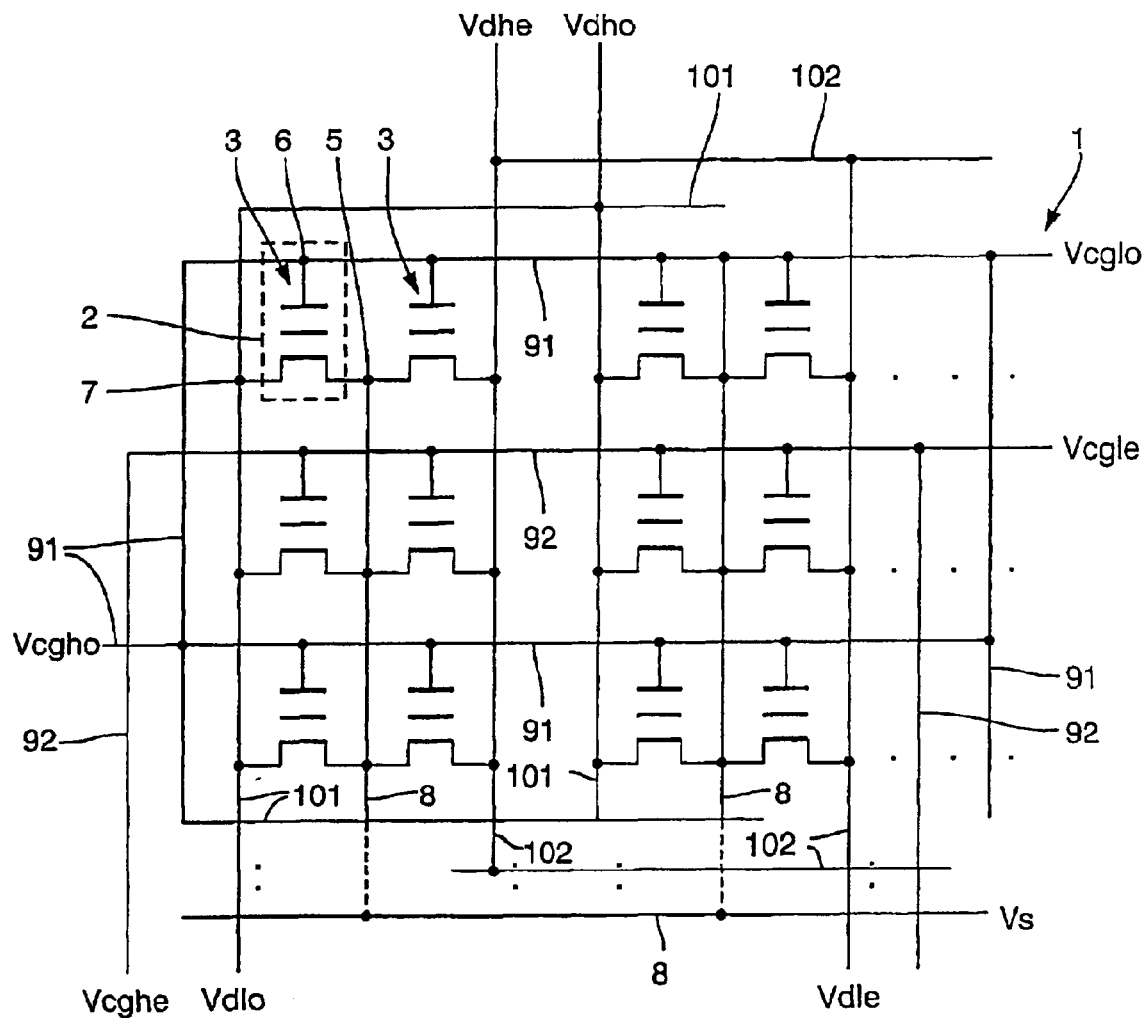
Figure 4:
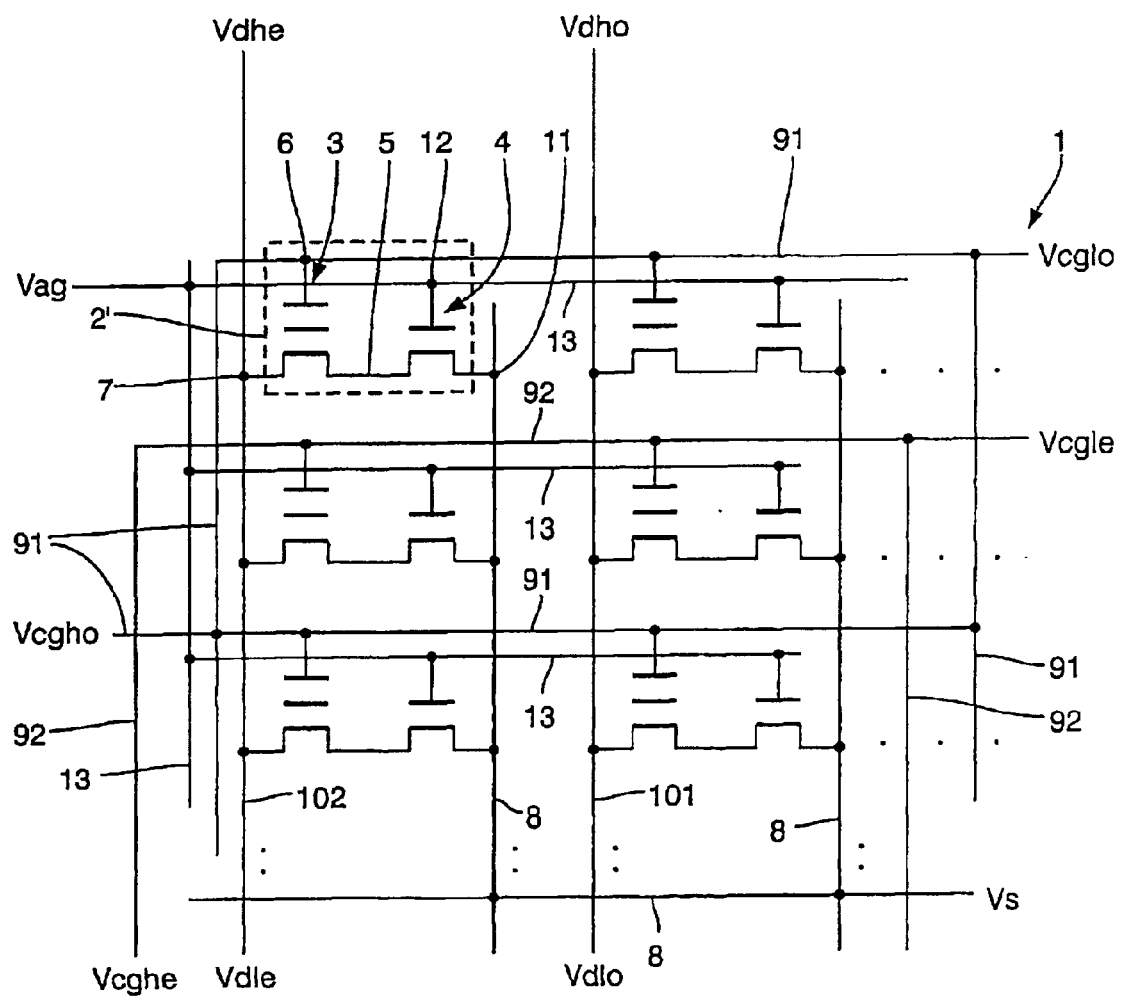
Figure 5:
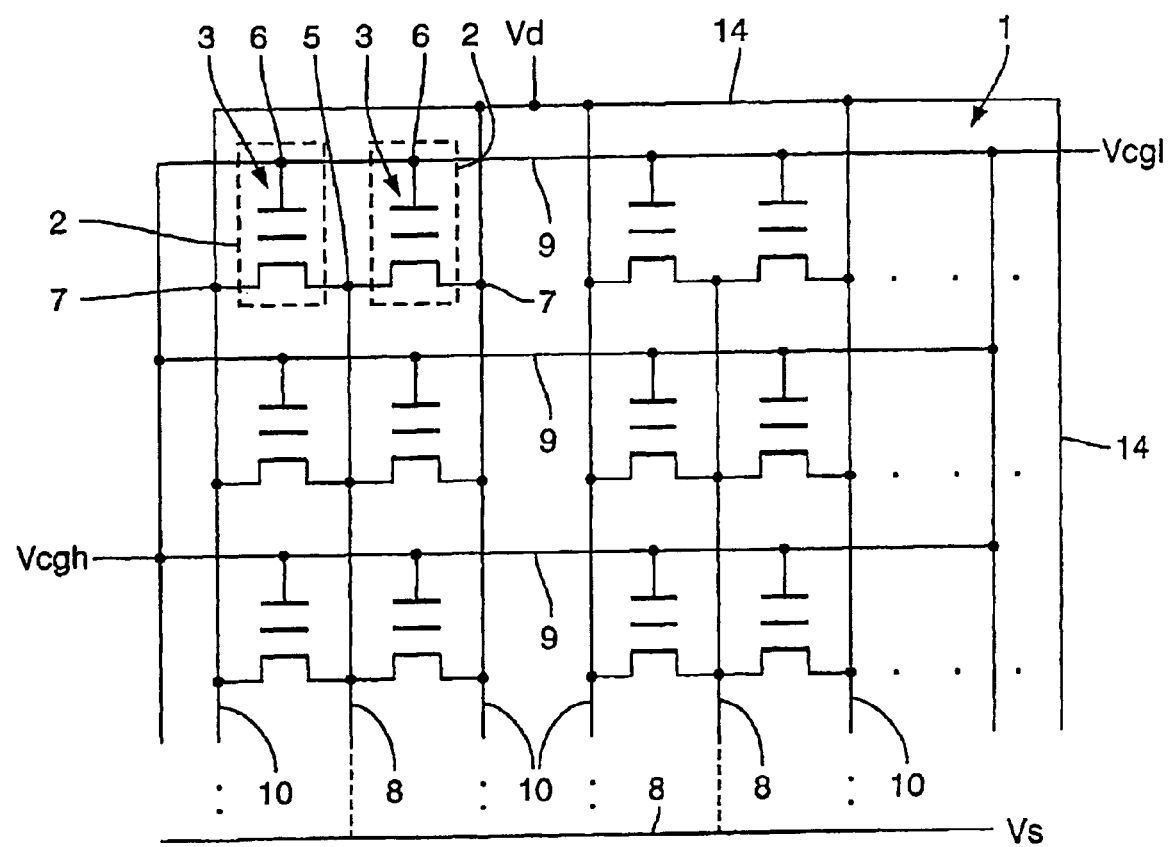
Figure 6A:
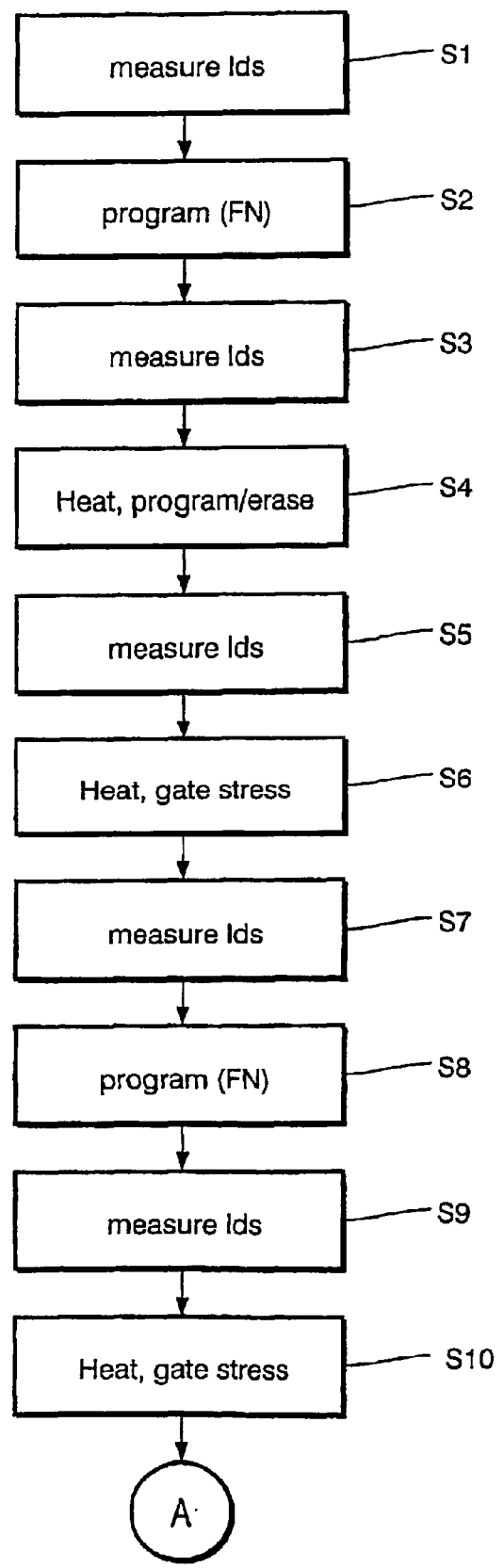
Figure 6B:
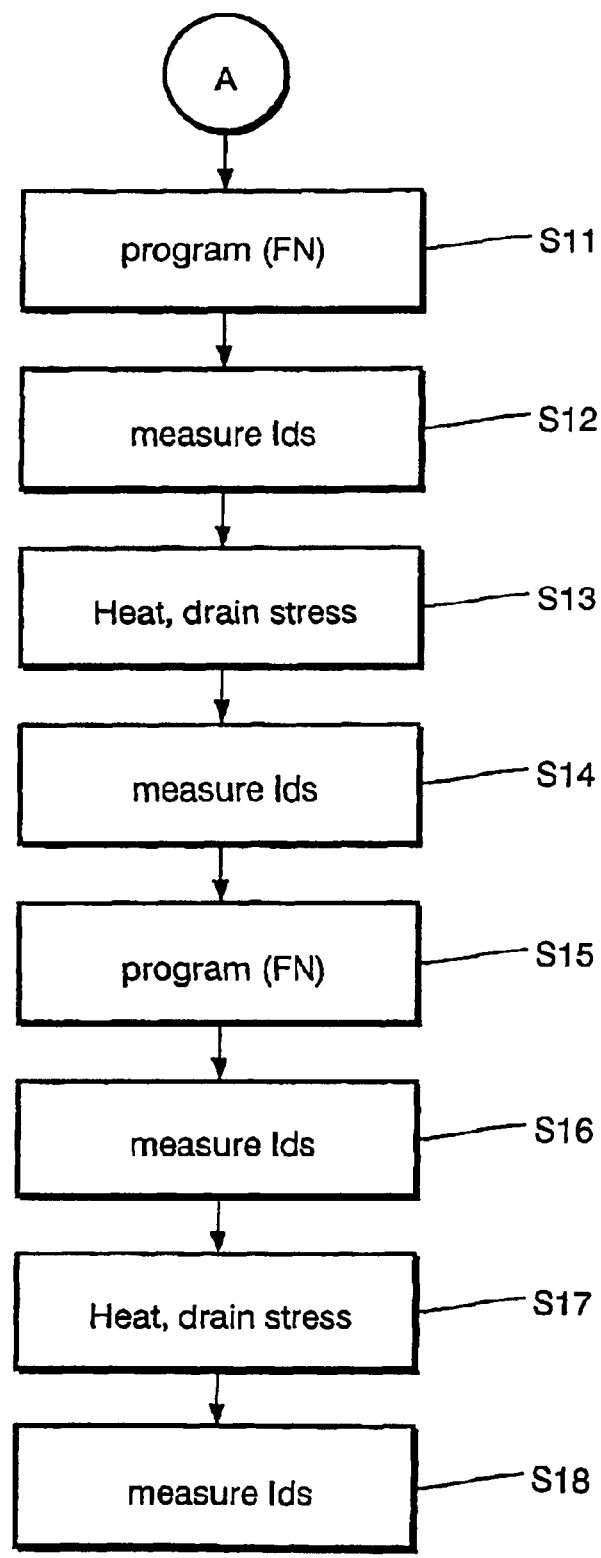

The present invention will be explained in more detail with reference to the drawings, in which FIG. 1 shows a circuit diagram of a first embodiment of a test structure according to the invention, FIG. 2 shows a circuit diagram of a second embodiment of a test structure according to the present invention, FIG. 3 shows a circuit diagram of a third embodiment of a test structure according to the present invention, FIG. 4 shows a circuit diagram of a forth embodiment of a test structure according to the present invention, FIG. 5 shows a circuit diagram of a fifth embodiment of a test structure according to the present invention, and FIG. 6 shows a flow diagram of a test method according to the present invention.

FIG. 1 shows a test structure 1 formed in a wafer of semiconductor material housing a plurality of memory devices (of which only test structure 1 is shown) before dice separation. The test structure 1 is formed by an array of memory cells 2 of which each comprises a memory transistor 3. The memory transistors 3 of the memory cells 2 have source terminals 5 connected together and to a source line 8, control gate terminals 6 connected together and to a control gate line 9 and drain terminals 7 connected together and to a drain line 10 (often called bit-line). The source line 8 is connected to a source pad at which an electrical source potential Vs can be applied. The drain lines 10 are connected to a drain pad at which a drain potential Vd can be applied. The control gate lines 9, in contrast, has two connections to a first and a second control gate pad to which a control gate voltage can be applied by applying a high control gate potential Vcgh can be applied to a first control gate pad and a low control gate potential Vcgl can be applied to a second control gate pad. Thus, an electrical current can be forced through the control gate line 9 heating up said control gate line 9 and providing the desired self-heating effect in the test structure 1.

The test structure 1 shown in FIG. 1 is manufactured simultaneously and using the same technology of memory devices (not shown) housed in the same wafer, and is tested to determine the electrical characteristics of the memory devices analogously to the above mentioned U.S. Pat. No. 6,128,219.

The charge stored on a flash cell as shown in FIG. 1 is typically expected to remain for a period of at least 10 years under normal operating conditions. Mechanisms which may allow the charge to degrade include thermal emission, band to band tunnelling, mobile ions attracted to the charged floating gate and others. Most of these mechanisms can be accelerated by high temperature and/or high voltage. The most common charge retention life time test is to charge the floating gate on the cell, measure the cell threshold voltage and then bake the wafer for some period of time at a high temperature. After this stress, the cell threshold voltage can be measured again. The degradation cell threshold voltage can be converted to an average leakage current, and a life time projection can be generated based on this measurement.

The instrumentation for a simple wafer bake test is trivial, but this test requires the wafers to be probed, baked and then probed again. Additionally, it is nearly impossible to force a voltage across the cell in an oven. According to the present invention the control gate lines 9 are therefore used for self-heating only the test structure rather than the entire wafer. The control gate line is generally a layer of polysilicon which, by application of an electrical current, allows to use said control gate line as a resistive heating element. This allows testing of a test structure in many ways which tests can be both accelerated by temperature and electrical field. Such tests are based on the principle of heating the test structure up, performing electrical stress and measuring the parameter change, which test may include endurance tests, gate stress, drain stress, continuous read stress or a combination of such tests at an elevated temperature. In practice, a small subset of tests will be used in production mode while other modes will be used in engineering mode. Details of such tests will be described below. Such test structures can be implemented on every wafer, particularly within the process control module which is a family of electrical test structures, mostly product independent, which are placed on every wafer to control the wafer quality. Test structures may be also placed between the products on the wafer, so called scribe-line, while in some cases they are placed on several pre-defined places on the wafer.

FIG. 2 shows an alternative embodiment of a test structure 1. In order to illuminate the control gate voltage influence during self-heating, the control gates 6 are grouped into odd and even gates. The odd gates, i.e. the gates 6 of the memory cells 3 of the odd rows in the cell array, are connected to a first (odd) control gate line 91 while the even gates, i.e. the gates of the memory cells of the even rows in the cell array, are connected to a second (even) control gate line 92. One of these gate lines 91, 92, e.g. the odd control gate line 91, can be used as heating element by applying a high and low control gate potential Vcgho, Vcglo, while the other control gate line, e.g. the even control gate line 92, can be used to apply a gate stress or endurance cycling by FN tunnelling by applying a high and low control gate potential Vcghe, Vcgle. All other lines and elements of the test structure shown in FIG. 2 are identical to the test structure shown in FIG. 1.

FIG. 3 shows a further embodiment of a test structure according to the present invention, which is based on the embodiment shown in FIG. 2. In order to monitor the temperature of the self-heated array the resistance change in the drain lines (10 in FIG. 2) can be measured. A separate connection of a first group of said drain lines, i.e. of the odd drain lines 101, and of a second group of drain lines, e.g. the even drain lines 102, can separate the resistance change from junction leakage. Therefore electrical voltages Vdho-Vdlo and Vdhe-Vdle can be measured at the pads of said first and second drain lines 101, 102. To enable said measurement allowing to determine a resistance change within said drain lines 101, 102 they are made of metal. These drain lines 101, 102 thus function as a "thermometer".

Still a further embodiment of a test structure 1 according to the present invention is shown in FIG. 4. Compared to the embodiment shown in FIG. 3 said test structure comprises a 2-transistor flash cell array in which each memory cell 2' comprises a memory transistor 3 as described above and, connected in series, a select transistor 4. The source terminal 5 of the memory transistor 3 is connected to the drain terminal 5 of the select transistor 12. The source terminal 11 of the select transistor 4 is connected to the source line 8. While the control gate 6 of the memory transistor 3 is connected to an odd or even control gate line 91 or 92 as described above, the access gates 12 of the select transistors 4 are connected together and to an access gate line 13 to which an access gate potential Vag can be applied. It should be noted that the access gate line 13 can also be split up into an odd and even access gate line to which the access gates of the select transistors 4 of the odd or even rows are connected, similar to the control gate lines. It should be noted that the drain line and source line can be defined in the other way around, the select transistor then being between control gate and drain in that case.

A preferred embodiment of a test structure similar to the embodiment shown in FIG. 1 is shown in FIG. 5. Therein a separate metal line 14 is used as temperature measuring means for measuring the temperature of the test structure during heating.

A particular test method for the embodiment of a test structure as shown in FIG. 4, however having odd and even access gate lines, will be explained with reference to FIG. 6 showing the steps of the test method. In a first step S1 the drain current Ids-Vcg curves, i.e. the current flowing in the connection line between the memory transistor 3 and the select transistor 4 from the drain terminal of the select transistor 4 to the source terminal of the memory transistor 3, is measured as a function of control gate voltage for the odd and even control gates and the drain lines separately. Typical conditions for this measurements are: Vdho=0.1 V, Vcgho sweep, Vago (odd access gate lines)=3.3 V (or other voltage to open this transistor), Vage (even access gate line)=0 V (closed), Vs=0 V, Vdhe=0 V (or floating no current), Vcghe=0 V, sub-flash well=0 V. Since the structure is symmetric, the voltages for the odd and even gate lines can be exchanged to measure other parts.

In a second step S2 the whole cell array is programmed according to the FN method, i.e. a positive pulse, e.g. 15 V for 1 ms, is applied to all control gate lines, while all others lines are grounded. However, the voltage and the time duration can vary.

In a third step S3 the drain current Ids is measured again as described in step S1.

In a fourth step S4 the odd control gates are heated by applying Vcgho=10 V and Vcglo=0 V. To the even control gates arrays/program is performed for a number of times, e.g. by applying Vcghe=+17 V and Vcgle=−17 V during 5 µs for 100,000 times. The heating voltage can vary from 1 V to 20 V depending on the resistance. The FN program/erase voltage can vary from 12 V to 20 V. The programming and erase time can vary from 1 µs to 500 ms. The erase/program can be applied from 1 to 2 million times.

In a fifth step S5 the drain current Ids is again measured as in step S1. Thereafter, in step S6, the odd control gates are heated as in step S2. In addition, the even control gates are stressed by applying −8 V for 10 s to the even control gate lines at the high or low voltage end. The gate stress voltage can vary from −5 V to −15 V, the stress time can vary from 1 s to 2.000 s.

In step S7 the drain source is again measured as in step S1, and in step S8 the whole array is programmed as in step S2. Thereafter, again step S1 is repeated as step S9.

In step S10 the even control gates are heated by applying Vcghe=10 V and Vcgle=0 V. A gate stress is performed to the odd control gate lines by applying −8 V for 10 s. The heating voltage can vary from 1 V to 20 V depending on the resistance. The gate stress voltage can vary from −5 V to −15 V and the stress time can vary from 1 s to 2.000 s.

In step S11 the whole array is programmed according to the EN method as described in step S2, and in step S12 the drain current is again measured as in step S1.

In step S13 the even control gate lines are heated as in step S9. In addition, drain stress is performed by applying +6 V for 10 s while the odd control gates are grounded or biased to a negative voltage. The drain stress voltage can vary from +3 V to +10 V, the stress time can vary from 1 s to 2.000 s. It should be noted that it is also possible to apply different voltages to the odd and even drain lines.

In step S14, again the drain current is measured as in step S1, and in step S15 the whole array is programmed as in step S2. Again, in step S16, the drain current is measured as in step S1.

In step S17 the odd control gate lines are heated as in step S6 and a drain stress is performed as in step S13. Finally, in step S18, the drain current is measured.

During the various stress steps, the access gates should be grounded and the sources should be floating. A concise test could also be a subset of the method as described and shown in FIG. 6. For a cell array with 2-transistor flash cells with select gate at the drain side in a NOR array with odd-even connections, a comprehensive test flow looks similar, but the access gates should be open, also during drain stress, and the source should be floating during stress. The measurements are similar as described above. Iteration-loops of these stress and measure steps, e.g. from any S_even stress point going back to S1, or other S_odd number can be incorporated in the flow.

For cell arrays with 1-transistor flash cells, negative voltages should be used for heating, e.g. Vcgho=−10 V, Vcglo=0 V or vice versa. For cell arrays with 1T-flash cells in an AND (or virtual ground) structure, the measurement condition in stress conditions need to be adjusted accordingly. Due to the symmetry of the cell array structure shown in FIG. 2 to 4, the odd and even gate lines could also be interpreted as even and odd gate lines. Endurance tests can be made at elevated temperature by using the odd control gate lines as heater and by applying a program/erase endurance stress to the even cells. The endurance of the even cells can be evaluated by Vt (threshold voltage) measurements before and after the stress or between the stress intervals. Further, retention measurements can be made at elevated temperature by pre-setting the array matrix to high Vt state, using the odd control gate lines as heater and by applying a negative gate stress to the even cells. The Id (drain source) versus Vcg (control gate voltage) characteristics of the even cells can be measured and compared before and after the stress or between the stress intervals. Stress induced leakage current (SILC) retention measurements can be made similarly as retention measurements, but for structures after extensive erase/program cycling.

The invention thus proposes a non-volatile memory PCM test structure to be used for fast reliability evaluation and monitoring of non-volatile memory technologies. The structure incorporates a non-volatile memory parallel array and an integrated heater. It fits into scribe line family, and is thus very suitable for reliability monitoring on every production wafer.

What is claimed is:

1. A non-volatile memory test structure, comprising a plurality of memory cells arranged in rows and columns, each memory cell comprising at least a memory transistor and having a source terminal, a gate terminal and a drain terminal, wherein:
   a group of said memory cells is connected in parallel,
   the source terminals of the memory cells in the group are connected together and to a source line,
   the drain terminals of the memory cells in the group are connected together and to a drain line,
   the gate terminals of the memory cells in the group are connected together and to a gate line, and
   said gate line has two connections to apply an electrical current to said gate line for using it as a heating means.

2. The non-volatile memory test structure according to claim 1, wherein
   a first number of said gaze terminals, in particular each odd numbered gate terminal, of the memory cells in the group are connected together and to a first gate line and
   a second number of said gate terminals, in particular each even numbered gate terminal, of the memory cells in the group are connected together and to a second gate line.

3. The non-volatile memory test structure according to claim 1, wherein each memory cell comprises a memory transistor and a select transistors connected in series,
   said gate terminal comprises a control gaze terminal and an access gate terminal,
   said control gate terminals of the memory cells in the group are connected together and to a control gate line,
   said access gate terminals of the memory cells in the group are connected together and to an access gale line, and
   said control gate line and/or said access gate line has two connections to apply an electrical current to said control gate line and/or said access gate line for using it as a heating means.

4. The non-volatile memory test structure according to claim 3, wherein
   a first number of said control gate terminals, in particular each odd numbered control gate terminal, of the memory cells in the group are connected together and to a first control gate line and
   a second number of said control gate terminals, in particular each even numbered control gate terminal, of the memory cells in the group are connected together and to a second control gate line.

5. The non-volatile memory test structure according to claim 1, wherein said drain line has two connections to measure an electrical voltage over said drain line for using it as temperature measuring means.

6. The non-volatile memory test structure according to claim 5, wherein
   a first number of said drain terminals, in particular each odd numbered drain terminal, of the memory cells in the group are connected together and to a first drain line and
   a second number of said drain terminals, in particular each even numbered drain terminal, of the memory cells in the group are connected together and to a second drain line.

7. The non-volatile memory test structure according to claim 1, further comprising a separate metal line having two connections to measure an electrical voltage over said metal line for using it as temperature measuring means.

8. The non-volatile memory test structure according to claim 5, further comprising a feedback-loop from said drain line or said separate metal line, respectively, to said gate line, in particular to a power supply means for applying an electrical current to said gate line.

9. A semiconductor wafer comprising a number of non-volatile memory devices and a non-volatile memory test structure according to claim 1.

10. A non-volatile memory test method for testing a test structure as claimed in claim 1, said test structure comprising a plurality of memory cells arranged in rows and columns, each memory cell comprising at least a memory transistor and having a source terminal, a gate terminal and a drain terminal, said method comprising the steps of:
    connecting a group of said memory cells in parallel,
    connecting the source terminals of the memory cells in the group together and to a source line,
    connecting the drain terminals of the memory cells in the group together and to a drain line,
    connecting the gate terminals of the memory cells in the group together and to a gate line,
    applying an electrical current to said gate line having two connections, using said gate line as a healing mans, and
    measuring the electrical behaviour of said memory cells.

11. The method as claimed in claim 10, wherein an endurance test, a gate stress, a drain stress and/or a continuous read stress are performed, in particular at an elevated temperature.

12. The method as claimed in claim 10 for testing a test structure as claimed in claim 2, further comprising the steps of:
    applying an electrical current to one of said numbers of gate terminals for heating the corresponding memory cells,
    applying a program or erase endurance stress to the other one of said numbers of gate terminals, and
    measuring the endurance stress at the memory cells associated with the gate terminals to which an endurance stress is applied before and/or after said application.

13. The method as claimed in claim 10 for testing a test structure as claimed in claim 2, further comprising the steps of:

applying an electrical current to one of said numbers of gate terminals for heating the corresponding memory cells, applying a negative stress to the other one of said numbers of gate terminals, and measuring the electrical current at the drain terminals of the memory cells associated with the gate terminals to which an endurance stress is applied before and/or after said application.

* * * * *